(12) United States Patent
Abe et al.

(10) Patent No.: US 9,099,198 B2
(45) Date of Patent: Aug. 4, 2015

(54) SEMICONDUCTOR MEMORY APPARATUS

(71) Applicant: FUJITSU LIMITED, Kawasaki-shi, Kanagawa (JP)

(72) Inventors: Jin Abe, Kawasaki (JP); Osamu Ishibashi, Kawasaki (JP); Sadao Miyazaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/541,187

(22) Filed: Nov. 14, 2014

(65) Prior Publication Data
US 2015/0155027 A1  Jun. 4, 2015

(30) Foreign Application Priority Data
Dec. 4, 2013  (JP) ................................. 2013-251075

(51) Int. Cl.
G11C 7/12 (2006.01)
G11C 11/408 (2006.01)

(52) U.S. Cl.
CPC .............. *G11C 11/4085* (2013.01); *G11C 7/12* (2013.01); *G11C 11/4087* (2013.01)

(58) Field of Classification Search
CPC ....................................................... G11C 7/12
USPC ........................................................ 365/203
See application file for complete search history.

(56) References Cited

U.S. PATENT DOCUMENTS

| 4,932,001 | A | | 6/1990 | Chow et al. | |
|---|---|---|---|---|---|
| 5,889,714 | A | * | 3/1999 | Schumann et al. | 365/203 |
| 2002/0023197 | A1 | * | 2/2002 | Miura et al. | 711/154 |

FOREIGN PATENT DOCUMENTS

| JP | 02-161690 | 6/1990 |
|---|---|---|
| JP | 07-065580 | 3/1995 |
| JP | 10-241359 | 9/1998 |
| JP | 2001-350462 | 12/2001 |

* cited by examiner

*Primary Examiner* — Hoai V Ho
*Assistant Examiner* — Jay Radke
(74) *Attorney, Agent, or Firm* — Fujitsu Patent Center

(57) ABSTRACT

A semiconductor memory apparatus includes a memory block to include memory cells to hold data; a precharge control unit to control precharging the memory cells; a row decoder to output a row selection signal identifying a row address of the memory cells; an integral circuit to integrate a signal level of the row selection signal for a same row address, and to have an integral characteristic where an integral value of the signal level becomes a predetermined value when the row selection signal for the same row address is consecutively output for a predetermined number of times; and a determination unit to determine whether the integral value of the integral circuit becomes the predetermined value or greater. The precharge control unit turns off precharging the memory cells when the integral value of the integral circuit becomes the predetermined value or greater.

7 Claims, 5 Drawing Sheets

SEMICONDUCTOR MEMORY APPARATUS

CROSS-REFERENCE TO RELATED APPLICATIONS

This application is based upon and claims the benefit of priority of the prior Japanese Priority Application No. 2013-251075 filed on Dec. 4, 2013, the entire contents of which are hereby incorporated by reference.

FIELD

The disclosures herein generally relate to a semiconductor memory apparatus.

BACKGROUND

Conventionally, a semiconductor memory apparatus has been known that includes a first decoder to select a word line depending on an address signal, a second decoder to select a pair of bit lines depending on the address signal, a precharge circuit to precharge the pair of bit lines, and an equalizer circuit to equalize the pair of bit lines.

This semiconductor memory apparatus includes an address change detection circuit to detect a change of the address signal decoded by the first decoder, and a precharge control circuit and an equalizer control circuit that make the precharge circuit and the equalizer circuit operate, respectively, when the address change detection circuit detects an address change (see, for example, Patent Document 1).

RELATED-ART DOCUMENTS

Patent Documents

[Patent Document 1] Japanese Laid-open Patent Publication No. 07-065580

Incidentally, microfabrication in semiconductor memory apparatuses in recent years has reached the level of several dozen nanometers.

In such a microfabricated semiconductor memory apparatus, when accesses concentrate on the same row address, coupling noise between adjacent word lines, bit inversion due to the coupling, and the like are generated, which may result in an operational defect.

One of the causes of the coupling noise or the bit inversion is that, when accesses concentrate on the same row address, the potential is fluctuated on the bit line due to precharging performed for every access, which is then mixed into the word line as noise.

SUMMARY

According to at least one embodiment of the present invention, a semiconductor memory apparatus includes a memory block configured to include a plurality of memory cells to hold data; a precharge control unit configured to control precharging the memory cells; a row decoder configured to output a row selection signal identifying a row address of the plurality of memory cells; an integral circuit configured to integrate a signal level of the row selection signal for a same row address, and to have an integral characteristic where an integral value of the signal level becomes a predetermined value when the row selection signal for the same row address is consecutively output for a predetermined number of times; and a determination unit configured to determine whether the integral value of the integral circuit is greater than or equal to the predetermined value, wherein the precharge control unit turns off precharging the memory cells when the determination unit determines that the integral value of the integral circuit is greater than or equal to the predetermined value.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

In the following, embodiments will be described in which a semiconductor memory apparatus is used according to the present invention.

Embodiments

Figure 1:
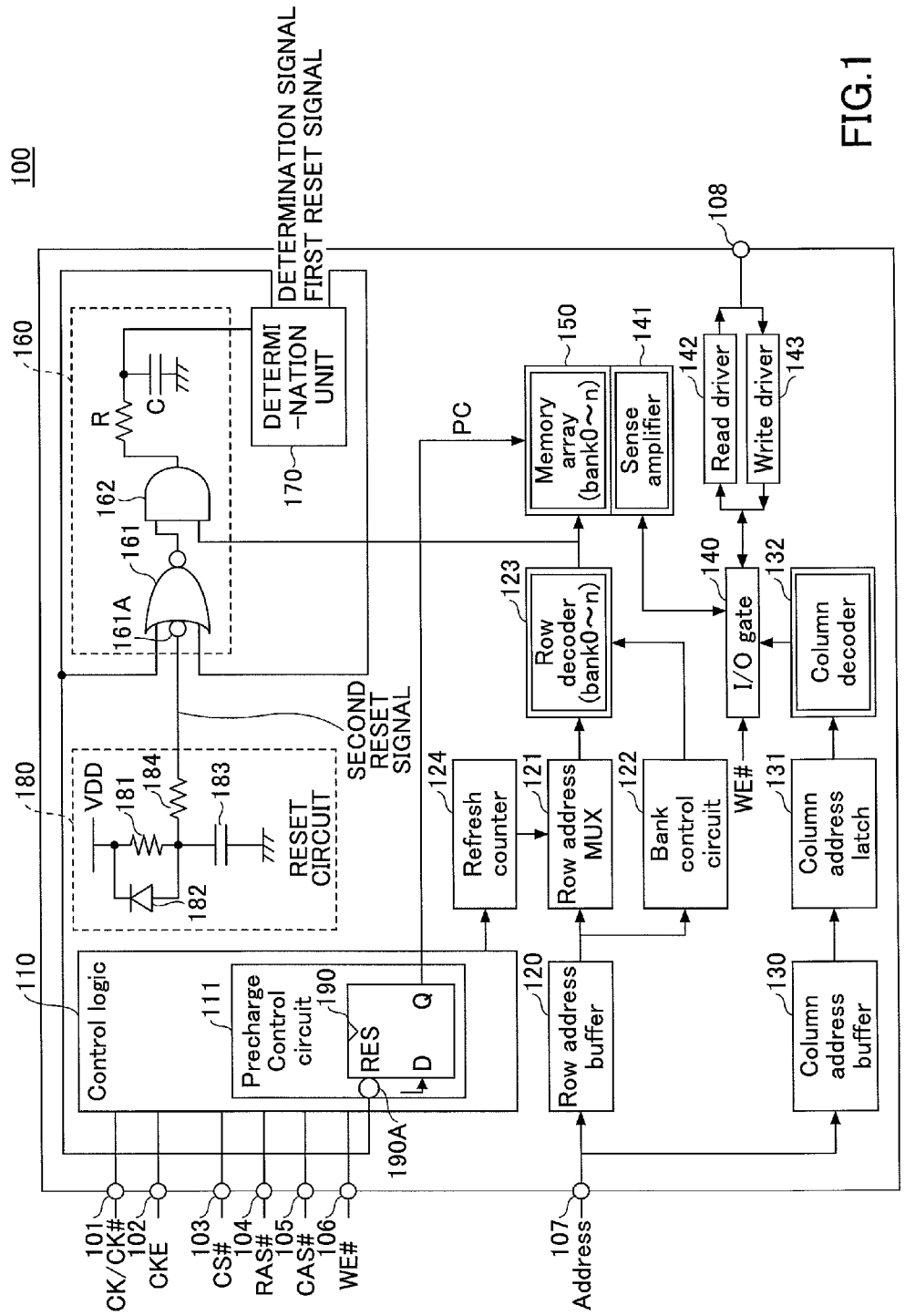
FIG. 1 is a diagram illustrating a memory 100 according to an embodiment of the present invention.

FIG. 1 is a diagram illustrating a memory 100 according to an embodiment of the present invention.

The memory 100 is, for example, a DRAM (Dynamic Random Access Memory), which is an example of a semiconductor memory apparatus. The memory 100 is implemented as an LSI (Large Scale Integrated circuit).

When selection operations (accesses) concentrate on the same row address, the memory 100 temporarily stops precharging if the same row address is consecutively selected for a predetermined number of times or greater, to suppress generation of an operational defect such as coupling noise or bit inversion caused by precharging. By stopping precharging to suppress generation of an operational defect such as coupling noise or bit inversion, stable operations can be realized. In the following, the configuration and operations of the memory 100 will be described.

The memory 100 includes terminals 101 to 108, a controller (Control logic) 110, a row address buffer 120, a row address multiplexer (MUX) 121, and a bank control circuit 122.

The memory 100 further includes row decoders 123, a refresh counter 124, a column address buffer 130, a column address latch 131, and column decoders 132.

The memory 100 further includes an I/O gate 140, a sense amplifier 141, a read driver 142, a write driver 143, and memory arrays 150.

The memory 100 further includes an integral circuit 160, a determination unit 170, a reset circuit 180, and an FF (Flip Flop) 190.

The terminals 101 to 104 receive a differential clock (CK/CK#), a clock enable signal (CKE), a chip select signal (CS#), and a row address strobe signal (RAS#) as input, respectively.

The terminals 105 to 107 receive a column address strobe signal (CAS#), a write enable signal (WE#), and an address signal (Address) as input, respectively. The address signal includes a row address signal, a column address signal, and a signal representing a bank number.

These signals are input from, for example, a CPU (Central Processing Unit) via a chipset (North Bridge) of a personal computer or a server that includes the memory 100. Note that a signal having a suffix of # in its signal name represents a signal that performs its operation at an L (Low) level.

The terminal 108 is a terminal to input data (write data) to be written into the memory arrays 150, and to output data (read data) read out from the memory arrays 150.

The controller 110 includes a precharge control circuit 111, which is a control unit to execute operational control of the memory 100 such as a DRAM, and implemented by, for example, a combinational circuit.

The controller 110 receives as input, via the terminals 101 to 106, the differential clock (CK/CK#), the clock enable signal (CKE), the chip select signal (CS#), the row address strobe signal (RAS#), the column address strobe signal (CAS#), and the write enable signal (WE#). The controller 110 outputs the differential clock (CK/CK#) to the refresh counter 124.

The precharge control unit 111 includes the FF 190, and outputs a precharge signal PC to the memory arrays 150 via the FF 190. When executing a data write or read for the memory arrays 150, the precharge control unit 111 outputs the precharge signal PC via the FF 190.

The precharge signal PC is provided to raise the potential of a bit line to a predetermined potential when executing a data write or read. Here, assume that, for example, the precharging raises the potential of a bit line to a half (VDD/2) of the potential of a power supply voltage VDD.

The FF 190 includes a D terminal (data input terminal), a Q terminal (data output terminal), a clock input terminal, and a reset terminal RES. The FF 190 receives a precharge signal generated by the precharge control unit 111 as input at the D terminal, and depending on the clock input into the clock input terminal, reflects the value at the D terminal on the Q terminal.

The Q terminal of the FF 190 is connected with terminals of the memory arrays 150 to feed the precharge signal PC. Namely, the FF 190 inputs the precharge signal PC into the memory arrays 150.

Also, an inversion calculation unit 190A is connected at the input side of the reset terminal RES of the FF 190. Therefore, the reset terminal RES of the FF 190 receives as input an inverted signal of a determination signal output from the determination unit 170.

While receiving an H-level signal as input at the reset terminal RES, the FF 190 reflects the value at the D terminal on the Q terminal. Once receiving an L-level signal as input at the reset terminal RES, the FF 190 resets the signal level of the Q terminal to the L level.

Therefore, while the determination signal is at the L level, the FF 190 reflects the precharge signal input at the D terminal on the Q terminal as it is. But once the determination signal takes the H level, the FF 190 resets the signal level of the Q terminal to the L level. Namely, once the determination signal takes the H level, the precharge signal is reset to the L level by the FF 190. The FF 190 is an example of a change unit. Note that "resetting the precharge signal to the L level" may be referred to as "turning off the precharge signal" below.

Also, although the present embodiment described here assumes that the FF 190 is disposed inside of the precharge control unit 111, the FF 190 may be disposed outside of the precharge control unit 111, or further outside of the controller 110. In this case, depending on the signal level of the determination signal, the FF 190 outputs the precharge signal output from the precharge control unit 111 as it is, or turns off the precharge signal output from the precharge control unit 111.

Note that, among operations of the memory 100, operations relating to precharging will be mainly described. Therefore, details of usual operations of a DRAM such as a data write, a data read, and the like are omitted for the memory 100.

The row address buffer 120 receives a row address signal and a signal representing a bank number included in the address signal as input via the terminal 107. The row address buffer 120 outputs the row address signal to the row address multiplexer 121, and outputs data representing the bank number to the bank control circuit 122.

The row address multiplexer 121 outputs the row address signal input from the row address buffer 120 to the row decoder 123 depending on the signal representing the bank number output from the bank control circuit 122. Also, when receiving a count-up signal as input from the refresh counter 124, the row address multiplexer 121 outputs the row address signal to the row decoder 123 to execute a refresh operation.

The bank control circuit 122 selects one of the row decoders 123 that corresponds to the signal representing the bank number that is input from the row address buffer 120.

Multiple row decoders 123 (n+1 instances) are provided depending on the number of banks of the memory arrays 150 (0 to n where n is an integer), which decode the row address signal, and output the row address data to the memory arrays 150. A row is selected in the memory arrays 150 by the row address data. Also, the output terminals of the row decoders 123 are connected with the input terminal of an AND circuit 162 of the integral circuit 160, which will be described later.

The refresh counter 124 counts a predetermined length of time to execute a refresh operation of a DRAM, by counting the differential clock (CK/CK#) input from the controller 110. The refresh counter 124 outputs a count-up signal to the row decoders 123 every predetermined time. Based on the count-up signal, the row decoders 123 execute refresh operations.

The column address buffer 130 receives a column address signal included in the address signal as input via the terminal 107. The column address buffer 130 outputs the column address signal to the column address latch 131.

The column address latch 131 holds the column address signal input from the column address buffer 130, and outputs the column address signal to the column decoders 132 at a timing to execute a data write or read.

Multiple column decoders 132 (n+1 instances) are provided depending on the number of banks of the memory arrays 150 (0 to n where n is an integer), which decode the column address signal, and output the column address data to the I/O gate 140.

Based on the write enable signal (W/E) input from the controller 110, the I/O gate 140 executes a data read from the memory arrays 150, or a data write to the memory arrays 150.

The sense amplifier 141 is provided for each of the banks of the memory arrays 150, and when executing a data write or read, amplifies the data and reshapes the waveform of the data.

The read driver 142 is a driver to output read data to the outside of the memory 100, which outputs the data (read data)

read from the memory arrays 150 to the terminal 108 when receiving the data as input from the I/O gate 140.

The write driver 143 is a driver to output write data input from the terminal 108 to the I/O gate 140.

Each of the memory arrays 150 includes a number of bit cells arranged in an array. Each of the bit cells is placed at a cross point of a word line and a bit line, which is specified by the word line identified by a row address and the bit line identified by a column address.

Multiple memory arrays 150 (n+1 instances) are provided, and each of the memory arrays 150 is assigned a bank number (0 to n where n is an integer). Each of the memory arrays 150 is referred to as a "bank" to be distinguished from the others, which is identified by data representing the bank number.

The integral circuit 160 includes a NOR circuit 161, an AND circuit 162, a resistor R, and a capacitor C. Although only one integral circuit 160 is illustrated in FIG. 1, an integral circuit 160 is connected with, for example, each of the word lines that connect the row decoders 123 and the memory arrays 150. For example, if a bank of the memory arrays 150 has 4096 word lines, 4096 integral circuits 160 are provided for the bank of the memory arrays 150.

Note that the number of the integral circuits 160 may not necessarily be the same as the number of word lines. For example, if a part of the memory arrays 150 is accessed less frequently for specific row addresses, integral circuits 160 may be provided for word lines corresponding to the other part that is accessed more frequently for the specific row addresses.

The NOR circuit 161 is an example of an inverted logical OR calculation unit of 3-input 1-output type, which receives as input a determination signal and a first reset signal output from the determination unit 170, and an inverted signal of a second reset signal output from the reset circuit 180.

Among the three input terminals of the NOR circuit 161, the input terminal connected with the output of the reset circuit 180 (the input terminal at the center in FIG. 1) has an inversion calculation unit 161A provided, with which the second reset signal output from the reset circuit 180 is inverted to be input into the NOR circuit 161.

The NOR circuit 161 outputs an H-level signal to the AND circuit 162 when all three input signal are at the signal level of the L level, or outputs an L-level signal to the AND circuit 162 when any one of the three input signals is at the H level.

The AND circuit 162 has one input terminal connected with the output terminal of the NOR circuit 161, and another input terminal connected with the output terminal of the row decoder 123. The output terminal of the AND circuit 162 is connected with one terminal of the resistor R.

The AND circuit 162 outputs row address data input from the row decoder 123 as it is when the output signal of the NOR circuit 161 is at the H level. On the other hand, the AND circuit 162 outputs an L-level signal when the output signal of the NOR circuit 161 is at the L level regardless of the value of the row address data.

The resistor R is provided for setting the time constant of the integral circuit 160, which is connected between the output terminal of the AND circuit 162 and one terminal of the capacitor C. The time constant will be described later.

The one terminal of the capacitor C (the upper terminal in FIG. 1) is connected with the output terminal of the AND circuit 162 via the resistor R, and the other terminal is grounded. The one terminal of the capacitor C is also connected with the determination unit 170, and the voltage between both terminals of the capacitor C is monitored by the determination unit 170.

When the output signal of the NOR circuit 161 at the H level, the row address data input from the row decoder 123 is output from the AND circuit 162 as it is, and the capacitor C accumulates electric charge generated by the H-level row address data when the output signal of the NOR circuit 161 is at the H level. Namely, the capacitor C accumulates electric charge depending on the number of row address selection operations.

The integral circuit 160 counts the number of consecutive selection operations of a word line using the RC integrator described above.

The number of consecutive selection operations of a word line is counted to suppress generation of an operational defect such as coupling noise or bit inversion caused by precharging when selection operations on the same row address (accesses) concentrate.

In the present embodiment, when there are, for example, a hundred thousand consecutive selection operations on the same row address, precharging is turned off. Comparing a data write with a data read in the memory 100, the data read takes a longer time than the data write. Therefore, the time constant of the RC integrator of the integral circuit 160 is set to have a characteristic where electric charge generated by a hundred thousand pieces of H-level row address data is accumulated within a time required for executing a hundred thousand consecutive data read operations. Note that the "time required for executing a hundred thousand consecutive read operations" will be simply referred to as the "required time" below.

The determination unit 170 determines whether the voltage between both terminals of the capacitor C of the RC integrator of the integral circuit 160 becomes greater than or equal to a predetermined voltage within the required time.

The determination unit 170 outputs an H-level determination signal if the voltage between both terminals of the capacitor C becomes greater than or equal to the predetermined voltage within the required time. The signal level of the determination signal output by the determination unit 170 is normally at the L level except for the above case of the H-level. The determination signal output by the determination unit 170 is input into the NOR circuit 161 and the reset terminal RES of the FF 190.

If the voltage between both terminals of the capacitor C is less than the predetermined voltage within the required time, the determination unit 170 outputs an H-level first reset signal to the NOR circuit 161 while holding the determination signal at the L level. The signal level of the first reset signal output by the determination unit 170 is normally at the L level except for the above case of the H-level.

Note that if the determination signal output by the determination unit 170 is at the H level, an L-level signal is input into the reset terminal RES of the FF 190, with which the precharge signal PC is turned off, and the H-level determination signal is input into the NOR circuit 161.

When the H-level determination signal is input into the NOR circuit 161, the output of the NOR circuit 161 takes the L level ('0'), and the output of the AND circuit 162 takes the L level ('0'), with which the capacitor C of the RC integrator is discharged to reset the integral circuit 160.

Namely, if the determination signal output by the determination unit 170 takes the H level, the precharge signal PC is turned off, and the integral circuit 160 is reset.

Note that after the integral circuit 160 has been reset by the H-level determination signal, the integral value of the RC integrator of the integral circuit 160 is less than the predetermined threshold, which makes the determination signal go back to the L level. When the precharge signal PC is output for the next time, precharging is normally performed, and the determination unit 170 monitors the integral value of the RC integrator.

Also, when the first reset signal output by the determination unit 170 takes the H level, an H-level determination signal is input into the NOR circuit 161. When the H-level first reset signal is input into the NOR circuit 161, the output of the NOR circuit 161 takes the L level ('0'), and the output of the AND circuit 162 takes the L level ('0'), with which the capacitor C of the RC integrator is discharged to reset the integral circuit 160.

Namely, if the first reset signal output by the determination unit 170 takes the H level, the integral circuit 160 is reset.

Also, after the integral circuit 160 has been reset by the H-level first reset signal, the integral value of the RC integrator of the integral circuit 160 is less than the predetermined threshold, which makes the determination signal remain at the L level. When the precharge signal PC is output for the next time, precharging is normally performed, and the determination unit 170 monitors the integral value of the RC integrator.

Note that the determination unit 170 described above may be implemented by, for example, a microcomputer executing the above determination.

The reset circuit 180 is a circuit to output an H-level second reset signal to reset the RC integrator of the integral circuit 160 when the power source of the memory 100 is turned on. The reset circuit 180 includes a resistor 181, a diode 182, a capacitor 183, and a resistor 184.

The resistor 181 and the capacitor 183 are connected with in series between the power source VDD and the ground potential node. One terminal of the resistor 181 (the upper terminal in FIG. 1) is connected with the power source VDD, and another terminal is connected with one terminal of the capacitor 183 (the upper terminal in FIG. 1). Another terminal of the capacitor 183 is grounded.

The one terminal of the resistor 181 is also connected with the cathode of the diode 182, and the other terminal of the resistor 181 is also connected with the anode of the diode 182.

The resistor 184 has one terminal (the terminal on the left side in FIG. 1) connected with a connection point between the resistor 181 and the capacitor 183, and another terminal connected with the inversion calculation unit 161A provided at the input side of the NOR circuit 161.

The signal output by the resistor 184 via the reset circuit 180 is the second reset signal. The reset circuit 180 momentarily outputs the second reset signal at the L-level in a state where the value of the power source VDD is 0 V when the power source VDD is being turned on. After that, when the output voltage of the power source VDD has risen to the predetermined voltage (VDD), the second reset signal output by the reset circuit 180 takes the H level.

When the value of the power source VDD momentarily is 0 V while the power source VDD is being turned on, the L-level second reset signal is inverted by the inversion calculation unit 161A, and an H-level signal is input into the NOR circuit 161. This makes the output of the NOR circuit 161 take the L level ('0'), and the output of the AND circuit 162 takes the L level ('0'), with which the capacitor C of the RC integrator is discharged, and the integral circuit 160 is reset. These operations are momentarily executed while the power source VDD is being turned on.

After the integral circuit 160 has been reset by the L-level second reset signal, when the precharge signal PC is output, precharging is normally performed, and the determination unit 170 monitors the integral value of the RC integrator.

Figure 2:
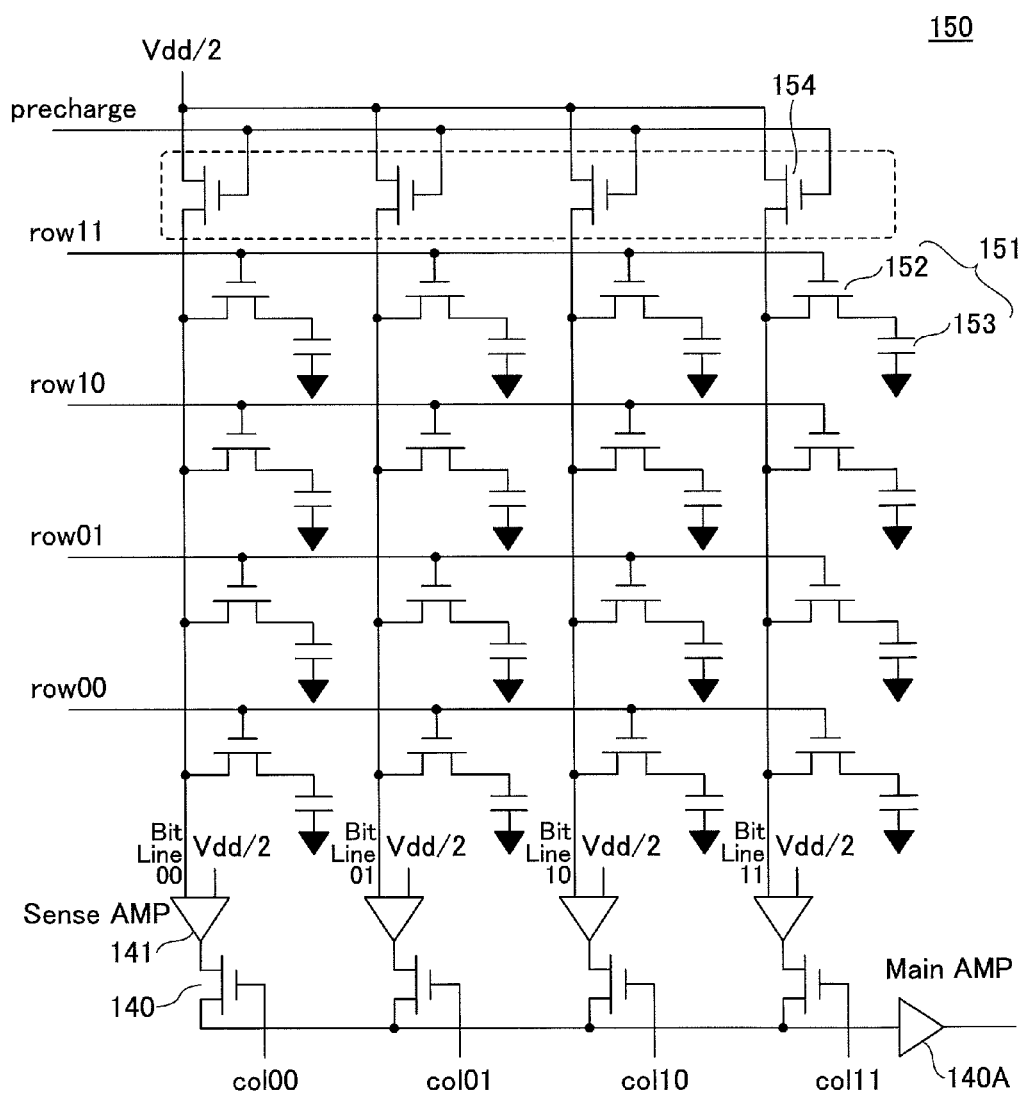
FIG. 2 is a diagram illustrating a configuration of a memory array 150 of a memory 100 according to the embodiment.

FIG. 2 is a diagram illustrating a configuration of the memory array 150 of the memory 100 according to the present embodiment.

FIG. 2 illustrates 16 bit cells 151 of the memory array 150. These 16 bit cells 151 are positioned at cross points between four word lines having row addresses of row00, row01, row10, and row11, respectively, and four bit lines (Bit Line 00, Bit Line 01, Bit Line 10, and Bit Line 11) having column addresses of co100, co101, co110, and co111, respectively.

Each of the bit cells 151 includes a transistor 152 and a capacitor 153. The transistor 152 is an NMOS (N channel Metal Oxide Semiconductor) transistor that has the gate connected with a word line, the source grounded, and the drain connected with a bit line.

One end of each of the bit lines (the upper end in FIG. 2) is connected with a transistor 154 for precharging. In FIG. 2, four transistors 154 are enclosed by a dashed line. The transistor 154 is an NMOS transistor, and its gate receives the precharge signal PC as input. In the memory 100 in the present embodiment (see FIG. 1), since the precharge signal PC is output from the FF 190, the gate of the transistor 154 is connected with the Q terminal of the FF 190.

The drain of the transistor 154 is connected with the power source (VDD/2), and the source is connected with one of bit lines (Bit Line 00, Bit Line 01, Bit Line 10, and Bit Line 11).

Also, the other end of each of the bit lines (the lower end in FIG. 2) is connected with a sense amplifier 141 and an I/O gate 140. The I/O gate 140 is an NMOS transistor, and its gate receives as input the column address (co100, co101, co110, or co111) from the input column decoder 132 (see FIG. 1). The drain of the transistor of the I/O gate 140 is connected with the sense amplifier 141, and the source is connected with the main amplifier 140A.

When executing precharging in the memory arrays 150 configured as above, the potential of the bit lines (Bit Line 00, Bit Line 01, Bit Line 10, and Bit Line 11) is set to VDD/2, by turning on the transistor 154 in a state where the transistor 152 is turned off.

Figure 3:
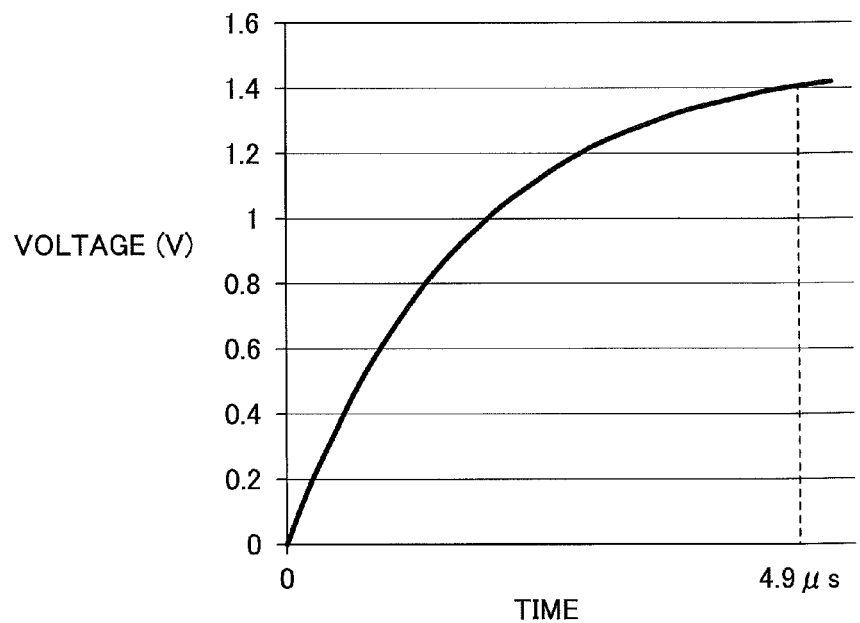
FIG. 3 is a diagram illustrating an integral characteristic of an RC integrator of an integral circuit 160 of a memory 100 according to the embodiment.

FIG. 3 is a diagram illustrating an integral characteristic of the RC integrator of the integral circuit 160 of the memory 100 according to the present embodiment.

In the present embodiment, to turn off precharging when consecutive selection operations on the same row address are executed, for example, for a hundred thousand times, the time constant of the RC integrator of the integral circuit 160 may be set to have a characteristic with which electric charge generated by a hundred thousand pieces of H-level row address data is accumulated within a time required for executing consecutive read operations for a hundred thousand times.

Here, the read cycle of the memory 100 is, for example, 48.75 ns in the present embodiment. When consecutive selection operations on the same row address are executed for a hundred thousand times, the time required for the hundred thousand read cycles is about 4.9 μs.

Also, for example, assume that when selection operations of a word line are executed for a hundred thousand times, the voltage value obtained by integrating electric charge generated by the H-level row address data is 1.4 V.

In such a case, the integral characteristic of the RC integrator of the integral circuit 160 may be a characteristic where the voltage reaches 1.4 V within 4.9 μs as illustrated in FIG. 3.

Therefore, with respect to the power supply voltage VDD of the memory 100, the resistance of the resistor R and the capacitance of the capacitor C of the RC integrator may be set to realize the time constant with which the integral characteristic illustrated in FIG. 3 is realized.

Namely, in the present embodiment, the required time may be set to 4.9 μs, and the predetermined threshold voltage used for determining the integral value of the RC integrator by the determination unit 170 may be set to 1.4 V. In this case, the determination unit 170 may determine whether the integral value of the RC integrator becomes greater than or equal to 1.4 V within the required time (4.9 μs).

Figure 4:
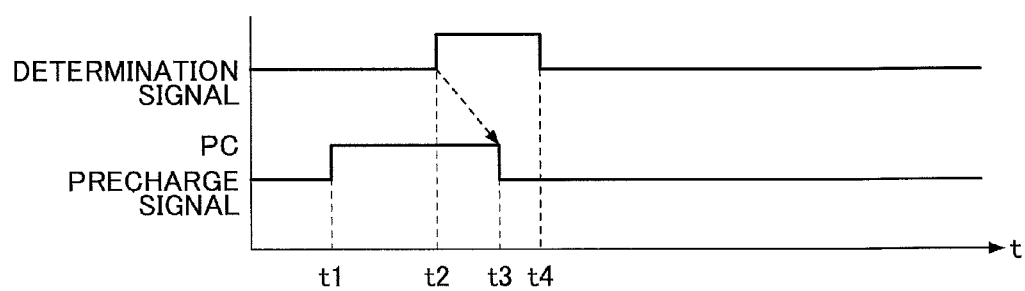
FIG. 4 is a diagram illustrating a timing chart of an operation to turn off a precharge signal PC in a memory 100 according to the embodiment.

FIG. 4 is a diagram illustrating a timing chart of an operation to turn off the precharge signal PC in the memory 100 according to the present embodiment. FIG. 4 illustrates the determination signal output by the determination unit 170, and the precharge signal PC output from the Q terminal of the FF 190.

At time t1, the precharge signal PC takes the H level, at time t2, the determination signal output by the determination unit 170 takes the H level, then at time t3, the precharge signal PC is turned off. This is a case where selection operations on the same row address (accesses) concentrate within the required time (4.9 μs) between times t1 and t2, which makes the integral value of the RC integrator reach the predetermined threshold voltage of the determination unit 170 (1.4 V), and the precharge signal PC output by the FF 190 is turned off at time t3.

After time t3, the precharge signal PC is kept turned off (until precharging restarts for the next time). Compared to a case where the precharge signal PC is not turned off, after time t3, generation of an operational defect such as coupling noise or bit inversion is suppressed, which means that operations can be stably executed even if accesses concentrate on the same row address.

Note that the determination signal goes back to the L level at time t4. This is because the RC integrator of the integral circuit 160 is reset as the determination signal has risen to the H level at time t2, which makes the integral value of the RC integrator be less than the predetermined threshold voltage of the determination unit 170 (1.4 V).

As described above, the memory 100 in the present embodiment turns off the precharge signal PC when accesses concentrate on the same row address.

Figure 5:
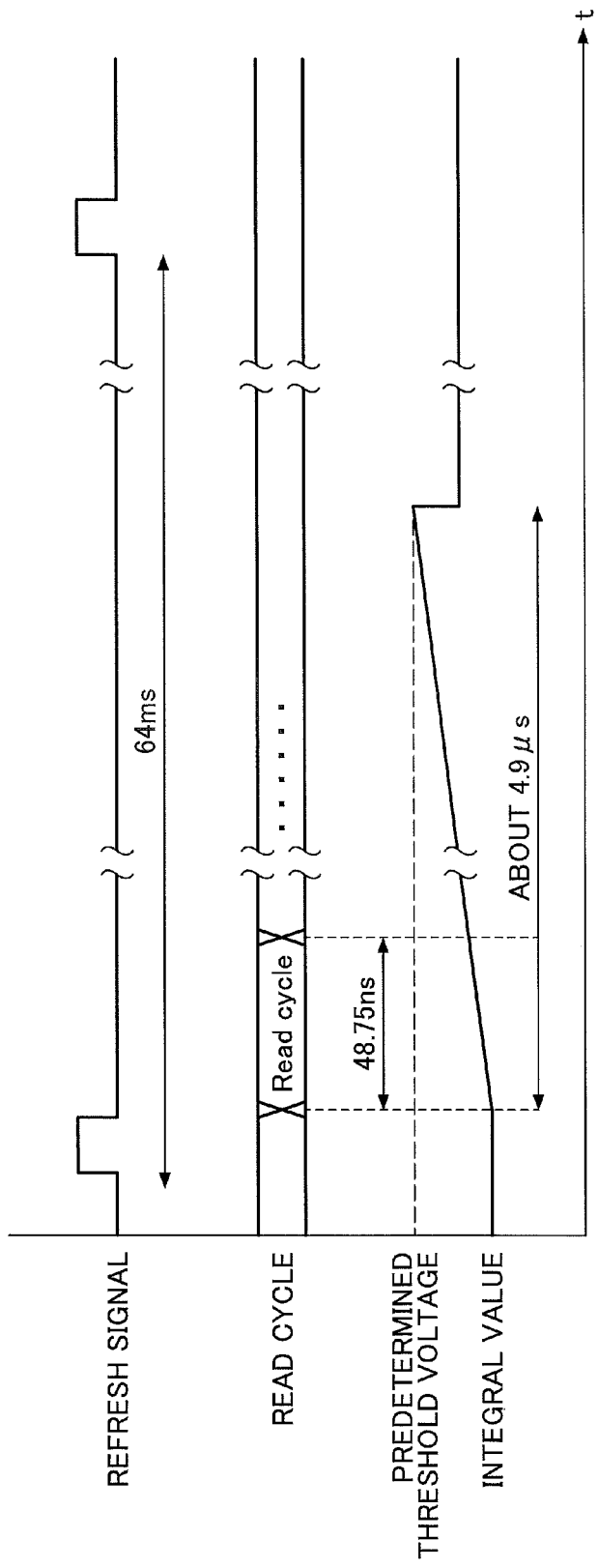
FIG. 5 is a diagram illustrating operational waveforms where a precharge signal PC is turned off in a memory 100 according to the embodiment.

FIG. 5 is a diagram illustrating operational waveforms where the precharge signal PC is turned off in the memory 100 according to the present embodiment. FIG. 5 illustrates a refresh signal, which is a refresh command of the memory 100, a read cycle of the memory 100, and the integral value of the integral circuit 160. Note that the horizontal axis in FIG. 5 is a time axis.

In the present embodiment, the read cycle is, for example, 48.75 ns, and when consecutive selection of a word line of the same row address are executed for a hundred thousand times, the time required for these read cycles is about 4.9 μs.

Therefore, after the H-level pulse of the refresh signal has gone back to the L level, the integral value goes up while consecutive read cycles on the same row address are executed, and when the time passes by about 4.9 μs, the integral value reaches the predetermined threshold voltage to be reset.

Here, assuming that the refresh period of the memory 100 is 64 ms, about 13000 sets of a hundred thousand read cycles may occur in a refresh period. Namely, a hundred thousand consecutive read cycles may occur 13000 times within a refresh period.

Therefore, if accesses concentrate on the same row address as described above, generation of an operational defect such as coupling noise or bit inversion can be suppressed by stopping precharging once in a hundred thousand times.

Therefore, according to the present embodiment, even if accesses concentrate on the same row address, a stably operational memory 100 can be provided.

Also, in general, to suppress generation of an operational defect such as coupling noise or bit inversion caused by precharging when accesses concentrate on the same row address as described above, there are some memories such as conventional DRAMs that restrict accesses to the same row address if accesses are consecutive for a certain number of times.

Such a restriction based on the number of accesses in a conventional memory may not be acceptable for some types of usage.

In contrast to this, the memory 100 in the present embodiment suppresses generation of an operational defect such as coupling noise or bit inversion caused by precharging when accesses concentrate on the same row address.

Therefore, it has a high usage value for any types of usage, and the stably operational memory 100 can be provided.

Also, a conventional memory described above that counts the number of accesses may require a huge-size circuit, which may occupy a large area in the LSI.

In contrast to this, the memory 100 in the present embodiment counts up the predetermined number of accesses by the RC integrator of the integral circuit 160, and then, stops precharging. Therefore, the circuit size of the RC integrator is small, which effects a reduction in the cost of the memory 100.

Note that although the memory 100 in the present embodiment stops precharging as described above, it has no adverse effect because, in a state where accesses concentrate on the same row address, the word line is held in an asserted state, the potential of the bit line is also held at the predetermined potential (VDD/2), and virtually no precharging is required in such a state.

Also, in the above description, although the determination unit 170 is assumed to be implemented by a microcomputer, the determination unit 170 may be implemented by any other type of a circuit that can execute the same determination.

Finally, using FIG. 6, a modified example of the integral circuit 160 will be described.

Figure 6:
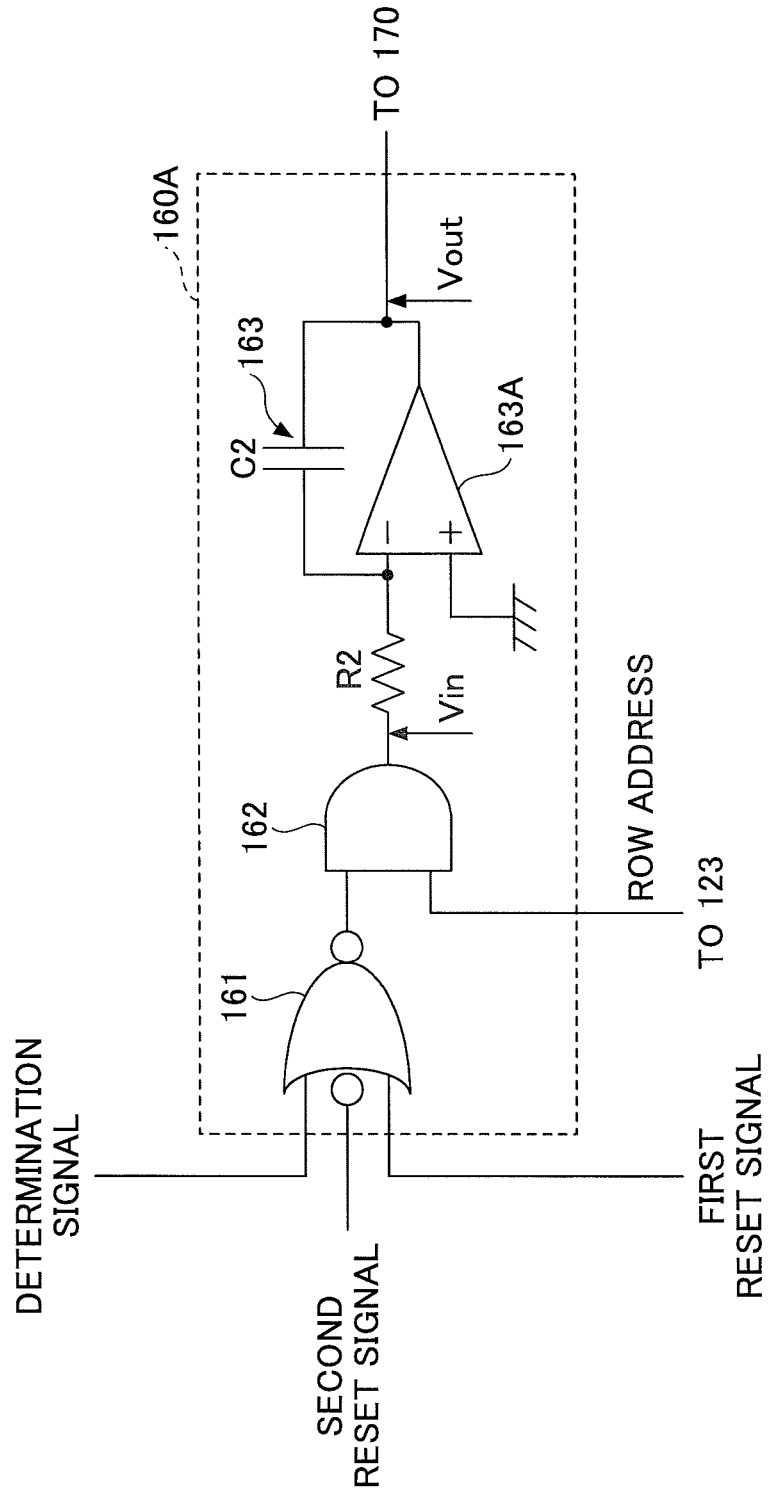
FIG. 6 is a diagram illustrating an integral circuit 160A according to a modified example of the embodiment.

FIG. 6 is a diagram illustrating an integral circuit 160A according to the modified example. The integral circuit 160A illustrated in FIG. 6 is a circuit built in the memory 100 instead of the integral circuit 160 illustrated in FIG. 1.

The integral circuit 160A includes an integrator 163 instead of the RC integrator illustrated in FIG. 1. The integrator 163 includes an operational amplifier 163A, a resistor R2, and a capacitor C2. The operational amplifier 163A has the non-inverted input terminal grounded, and the inverted input terminal connected with the output terminal of an AND circuit 162 via the resistor R2. Also, the output terminal of the operational amplifier 163A (the output terminal of the integrator 163) is connected with the determination unit 170.

The integrator 163 outputs a voltage Vout that integrates an input voltage Vin. Therefore, when the output voltage Vout becomes greater than or equal to the predetermined threshold voltage of the determination unit 170, the determination unit 170 outputs an H-level determination signal. This makes it possible to implement substantially the same operation as when using the integral circuit 160 illustrated in FIG. 1.

Note that any integral circuit other than the integral circuits 160 and 160A can be used instead of the integral circuits 160 and 160A as long as the circuit can integrate a value corresponding to the number of selection operations on the same row address.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A semiconductor memory apparatus comprising:
a memory block configured to include a plurality of memory cells to hold data;
a precharge control unit configured to control precharging the memory cells;
a row decoder configured to output a row selection signal identifying a row address of the memory cells;
an integral circuit configured to integrate a signal level of the row selection signal for a same row address, and to have an integral characteristic where an integral value of the signal level becomes a predetermined value when the row selection signal for the same row address is consecutively output for a predetermined number of times; and
a determination unit configured to determine whether the integral value of the integral circuit is greater than or equal to the predetermined value,
wherein the precharge control unit turns off precharging the memory cells when the determination unit determines that the integral value of the integral circuit is greater than or equal to the predetermined value.

2. The semiconductor memory apparatus as claimed in claim 1, wherein the integral circuit includes
a logical AND calculation unit configured to calculate a logical AND between the row selection signal output from the row decoder and a determination signal output from the determination unit, and to output the logical AND reflecting the row selection signal when the determination signal represents that the integral value is less than the predetermined value, and
a capacitor configured to accumulate a level of the logical AND output by the logical AND calculation unit, and
wherein the integral circuit outputs a voltage between terminals of the capacitor as the integral value.

3. The semiconductor memory apparatus as claimed in claim 2, wherein the integral circuit further includes a resistor configured to be connected between an output terminal of the logical AND calculation unit and the capacitor,
wherein the integral characteristic of the integral circuit is where the integral value becomes the predetermined value within a required time for the row decoder to consecutively output the row selection signal for the predetermined number of times, and the characteristic is set based on a time constant specified by a resistance of the resistor and a capacitance of the capacitor.

4. The semiconductor memory apparatus as claimed in claim 3, wherein the determination unit outputs a reset signal to reset the integral value when the integral value does not reach the predetermined value within the required time.

5. The semiconductor memory apparatus as claimed in claim 2, further comprising:
a reset circuit configured to output a reset signal at an H level to reset the capacitor when a power source is being turned on, and to output the reset signal at an L level after the power source has been turned on,
wherein the integral circuit further includes an inverted logical OR calculation unit configured to be disposed at a preceding stage of the logical AND calculation unit, and to output an inverted logical OR between the determination signal and the reset signal to the logical AND calculation unit,
wherein, after the power source has been turned on, the inverted logical OR output by the inverted logical or calculation unit is input into the logical AND calculation unit, as a signal representing the determination signal.

6. The semiconductor memory apparatus as claimed in claim 1, wherein the integral characteristic of the integral circuit is where the integral value becomes the predetermined value within a required time for the row decoder to consecutively output the row selection signal for the predetermined number of times.

7. The semiconductor memory apparatus as claimed in claim 1, further comprising:
a change unit configured to change the signal level of the precharge signal output by the precharge control unit into a signal level to turn off the precharging when the determination unit determines that the integral value is greater than or equal to the predetermined value.

* * * * *